United States Patent [19]

Eibl

[11] Patent Number: 5,665,662

[45] Date of Patent: Sep. 9, 1997

[54] HIGH-TEMPERATURE SUPERCONDUCTOR

[75] Inventor: Oliver Eibl, Munich, Germany

[73] Assignee: Siemens Aktiengesellschaft, Munich, Germany

[21] Appl. No.: 576,408

[22] PCT Filed: Mar. 10, 1989

[86] PCT No.: PCT/DE89/00154

§ 371 Date: Nov. 8, 1990

§ 102(e) Date: Nov. 8, 1990

[87] PCT Pub. No.: WO89/08929

PCT Pub. Date: Sep. 21, 1989

[30] Foreign Application Priority Data

Mar. 14, 1988 [DE] Germany .................. 38 08 447.3

[51] Int. Cl.$^6$ .................. C01F 11/02; H01L 39/12
[52] U.S. Cl. .................. 501/123; 505/782; 505/121; 505/125; 505/501
[58] Field of Search .................. 505/1, 782, 121, 505/125, 501; 501/123

[56] References Cited

U.S. PATENT DOCUMENTS 4,880,771  11/1989  Cava et al. .................. 505/1

OTHER PUBLICATIONS

Liu, et al, "Crystal Growth and Superconductivity in the Bi–Ca–Sr–Cu–O System", Physics Letters A, vol. 127 No. 8.9, Mar. 14, 1988, pp.444–446.

Kang, et al, "Superconductivity in Thin Films of the Bi–Ca–Sr–Cu–O System" Physics Letters A, vol. 128, No. 1.2, Mar. 21, 1988, pp.102–104.

Anil Khurana, "The $T_c$ to Beat is 125 K", Search & Discovery, Apr. 1988, pp. 21–25.

Tarascon, et al "Crystal Substructure and Physical Properties of the Superconducting Phase $Bi_4(Sr,Ca)_6Cu_4O_{16+x}$," Physical Review B, vol. 37,No. 16, pp.9382–9388.

Kijima, et al "Identification of a High $T_c$ Superconducting Phase, et al," Japanese Jornal of Applied Physics, vol. 27, No. 3, Mar. 1988, pp. L369–L371.

Muromachi, et al "Identification of the Superconducting Phase, etc", Japanese Journal of Applied Physics, vol. 27, No. 3, Mar. 1988, pp. L365–L368.

Komatsu, et al "Preparation of High $T_c$ Superconducting, etc.," Japanese Jornal of Applied Physics, vol. 27, No. 4, Apr. 1988, pp. L533–L535.

Matsui, et al "High–Resolution Electron Microscopy, etc", Japanese Jornal of Applied Physics, vol. 27, No. 3, Mar. 1988, pp. L361–L364.

Nach. Chem. Tech. Lab. vol. 36–No. 4, Apr. 1988.

Cava, et al "Studies of Oxygen Deficient, etc", North Holland Physics, pp. 560–565. *no date.

Chu, et al "Superconductivity up to 114 K, etc", Physical Review Letters, vol. 60, No. 10, Mar. 7, 1988, pp. 941–943.

Adachi et al. "Superconductivity Properties in a Bi–Sr–Ca–Cu–O System", Jap. J. App. Phy., vol. 27, Mar. 1988, pp. L344–46.

Chu et al, "Superconductivites up to 114k in the Bi–Al–Ca–Sr–Cu–O Compound" Phy Rev Lett. vol. 60, #10, 7 Mar. 1988.

*Primary Examiner*—Mark L. Bell
*Attorney, Agent, or Firm*—Hill, Steadman & Simpson

[57] ABSTRACT

A high-temperature superconductor material based on the Bi—Sr—Ca—Cu—O system has the nominal composition:

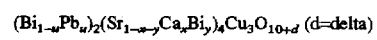

$$(Bi_{1-u}Pb_u)_2(Sr_{1-x-y}Ca_xBi_y)_4Cu_3O_{10+d} \quad (d=delta)$$

wherein $0.01 < x < 0.5$
$0 \leq y < x < 0.5$
$0 \leq d$
$0 \leq u$.

The high-temperature superconductor material has a transition temperature greater than 90° K.

11 Claims, 1 Drawing Sheet

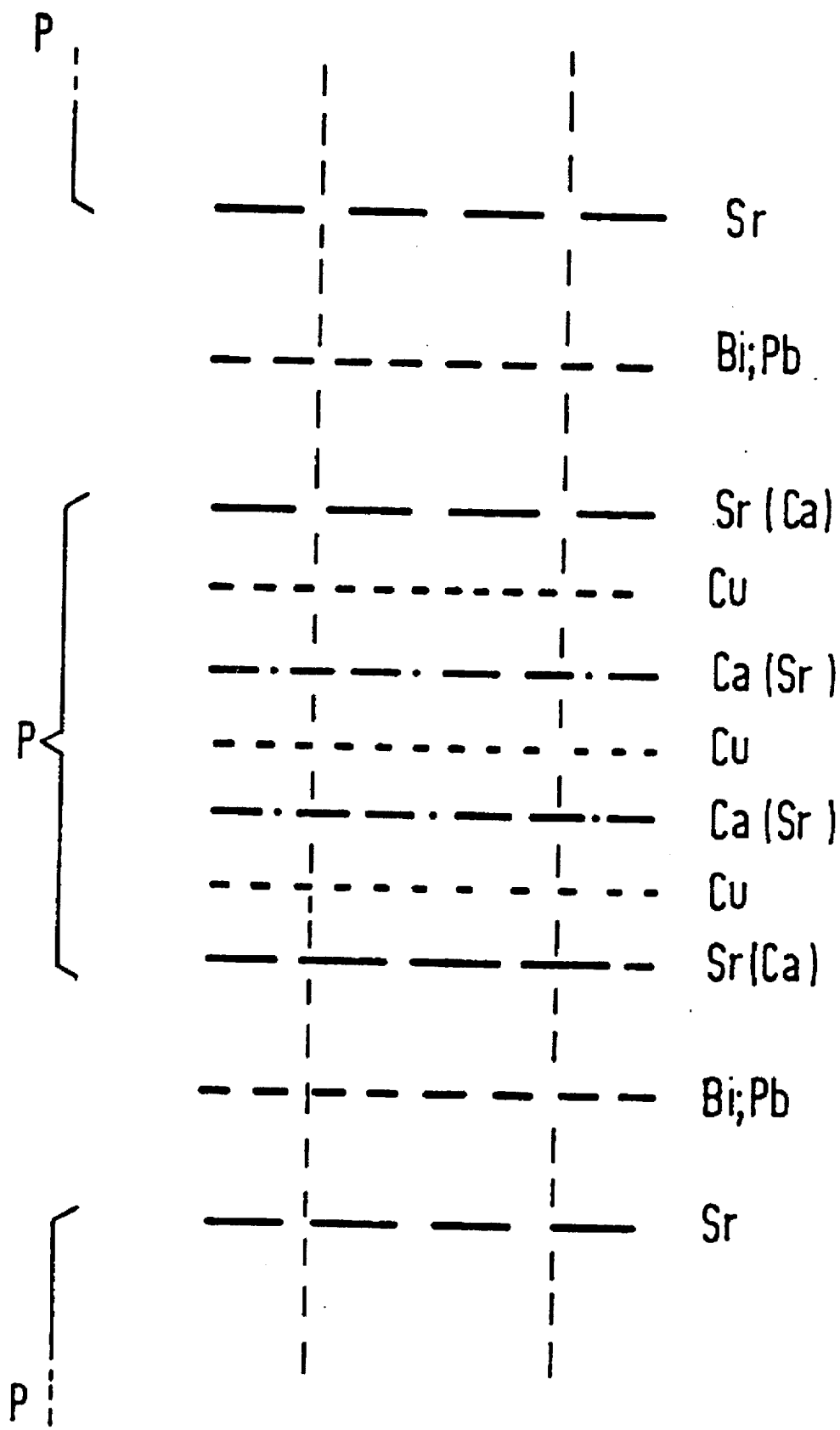

HIGH-TEMPERATURE SUPERCONDUCTOR

BACKGROUND OF THE INVENTION

The present invention is directed to a high-temperature superconductor of the system Bi—Sr—Ca—Cu—O.

Bednorz and Mueller disclosed superconductors based on lanthanum-strontium-copper oxide that have a high transition temperature of the transition from normal conduction into superconduction that was hitherto never achieved. Transition temperatures achieved for yttrium-barium-copper oxide systems lie at 70 through 90 K. Another system, bismuth-strontium-calcium-copper oxide recently has been disclosed and is currently under intensive investigations. The influence of the sintering parameters such as sintering temperature, sintering duration and partial oxygen pressure during the sintering process have been investigated.

The manufacture of the material cited second above proceeds based on the pulverization of initial nominal materials that are mixed, ground and cold-pressed. The sintering ensues in microprocessor-controlled furnaces, whereby the material is placed on zirconium oxide plates. Sintering temperatures that are applied when sintering in air lie at 800°, 860°, 880°, 900° C., whereby the sintering is performed for a duration of ten hours.

Gold contacts are applied to the resultant materials for measuring the electrical properties. The magnetic properties of a respective material are identified by measuring the inductivity of a coil that surrounds the material.

SUMMARY OF THE INVENTION

It is an object of the present invention to provide a the chemical composition of high-temperature superconductor material that has a high transition temperature above 90 K.

This object is achieved with a material based on the Bi—Sr—Ca—Cu—O system having the nominal composition:

wherein $0.1 < x < 0.5$ $0 \leq y < x < 0.5$ $0 \leq d$ $0 \leq u$ having a transition temperature greater than 90 K.

BRIEF DESCRIPTION OF THE DRAWINGS

The FIGURE illustrates a portion of the layer sequence of a superconducting structure of the present invention.

DETAILED DESCRIPTION OF THE PRESENTLY PREFERRED EMBODIMENTS

The present invention is based on the following observations:

A sharp drop in resistance and inductivity were measured at compositions of the system $BiSrCaCu_2O_x$—(−) (this formula represents the nominal composition. The dependency of the zero resistance on the temperature was measured between 55 and 175 K. The curve of the dependency between zero resistance and temperature exhibited two stages of the drop in resistance for the material, that had been sintered for ten hours in air at temperatures from 860 through 880° C. Appropriate linear extrapolation yielded values of between 100 and 105 K. for a superconducting phase transition.

This result was reproducible and was also very pronounced for specimens having longer sintering time. Semiconductor behavior was observed for specimens having sintering temperatures of 900° C. and above.

Other investigations were performed pursuant to the present invention and were directed to developing a material from the investigated material having two-phase or a multi-phase structure whose composition provided a transition temperature between 100 and 105 K.

The invention is based on the further observation that the above-recited material is multi-phase and a co-existence of two superconductor materials is present therein, whereof the one material has the recited, high transition temperature.

The inventor has succeeded in discovering that such a material having a transition temperature of approximately 105 K. is that material that is at least composed of a high majority of only one phase of the system bismuth-strontium-calcium-copper oxide, particularly having a partial bismuth substitution by lead. It is known from Science, Volume 239 (February 1988), pages 1015/1016, particularly FIG. 3, that the superconducting material of the system having a nominal composition of bismuth oxide-strontium-calcium-copper oxide has a layer structure with alternating bismuth oxide layers on the one hand and sequences of layers of strontium/copper/calcium(strontium)/copper/strontium oxide on the other hand.

The inventor has found that a phase having the lattice constants of $a=0.54$ nm and $c=3$ nm (measured from electron-microscopic diffraction patterns), namely a phase as known from the aforementioned publication, has a transition temperature of 80 K. However, the presence of yet a farther phase was identified for which the lattice constant a is 0.54 nm, but, for which the lattice constant $c=3.6$ nm was identified as −3.7 through 3.8 m through an even more exact identification. More detail investigations lead to the discovery that this phase also has especially technologically advantageous superconducting properties having the high transition temperature at 105 K.

The material has an orthorhombic lattice with A-centered orthorhombic symmetry according to previous analyses. The electron-microscopic diffraction pattern in the /010/axis allows a distinction to be made between A-centered and F-centered orthorhombic lattice.

It has been found that the structure having $a=0.54$ nm and $c=3.6$ nm or, respectively, 3.7 through 3.8 nm that is important to the present invention has a 5-fold or, respectively, 8.7-fold superstructure parallel to the /010/ or, respectively, /100/ direction. The unit cell of this material of the invention has a structure that includes $BiO_x$ double layers and perovskite cells composed of strontium oxide, (calcium oxide) and copper oxide. These unit cells can also additionally contain bismuth or bismuth and lead. The material of the invention thus has a sandwich-like structure with alternating layers of bismuth oxide or, respectively, $(Bi_{1-u}Pb_u)$-oxide and of perovskite cells that are in turn have an intrinsically layer-like construction. In an embodiment, the present invention has a structure that has the following layer sequence, with, for example, n=0 as well:

($bismuth_{1-u}lead_u$)/strontium(calcium)/copper/calcium (strontium)/copper/calcium(strontium)/copper/strontium(calcium)/($bismuth_{1-u}lead_u$) with the lattice constant $c=3.6$ nm discussed above. In the equation parenthetical elements can, in part, replace the elements mentioned before them.

The superconductor material of the invention has a stoichiometric composition:

wherein $0.01<x<0.5$; wherein $0 \leq y<x<0.5$; wherein $0$ less $\leq d$ and wherein $0 \leq u$, whereby the transition temperature is greater than 90 K. In an embodiment, d is approximately equal to 2 y. In an embodiment d is approximately equal to n. In an embodiment, u is greater than or equal to 0.1 and less than or equal to 0.3, for example u can be equal to $0.2 \pm 10\%$.

It has been found that, the transition temperature of such material can be 105 through 120 K.

Even though some compositions of the present invention do not entirely exhibit the recited, high transition temperatures of 105 through 110 K., this material of the invention, nonetheless provides great technical advantage in comparison to competitive superconductor materials of the appertaining type. One advantage is that the material of the present invention also does not react as quickly with the atmosphere, i.e. has a high resistance to the atmosphere.

The manufacture of material of the present invention can proceed in an intrinsically standard way. The respective nominal substances (oxides, carbonates and the like) corresponding to the composition set forth in the equations having optionally prescribed values for x, y, d and u lying within the framework of the above limits are weighed. Dependent on losses that occur during the manufacturing steps (losses due to grinding, filtering, converting and sintering), corresponding additions are taken into consideration in the weigh-in so that the initial material results.

The weighed substances are mixed with one another and ground, whereby the mixing particularly ensues during the grinding and the grinding is implemented with standard ball mills. The material present after the grinding is converted in a standard way for implementation of the conversion (conversion into the oxides) at standard high temperatures (700° through 1000°, particularly 800° through 820° C.). After another grinding step, the pressing and sintering of the composition proceeds. Sintering is performed between 800° and 1000° C., in an embodiment, at 880°±20° C., in a preferred embodiment, at 860° through 865° C. for ten hours, but particularly, however, 60 through 120 hours and preferably in air. This manufacturing method yields material that is superconducting, namely components having the dimensions established by the shaping and the pressing. Further processing steps that are standard for such material can be implemented.

By way of example, and not limitation, an example of the present invention is as follows: nominal weighed-in quantities of BiPbSrCaCuO are used as follows: $Bi_{1.7}Pb_{0.4}Sr_{1.7}Ca_{2.1}Cu_3$ as $Bi_2O_3$, PbO, $SrCO_3$, CaO and CuO.

The conversion ensues at 800° C. over three hours and at 820° C. for 10 through 20 hours in air with an intermediate grinding. Grinding and pressing are then carried out again. The sintering occurs at 860° through 865° C. for 60 through 120 hours in air. A sintering at 843° C., 60 through 120 hours in an argon-oxygen mixture given p=1/13 bar carried out instead leads to a result of the same quality.

The figure illustrates a portion of a layer sequence of the structure of a material of the present invention. The c-axis proceeds in vertical direction.

P references three perovskite cells.

I claim:

1. A superconductor of the Bi—Sr—(Ca)—CuO$_x$ system comprising:

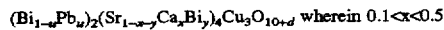 wherein $0.1<x<0.5$ $0 \leq y<x<0.5$
$0 \leq d$
$0 \leq u$ having a transition temperature greater than 90 K., said superconductor consisting of unit cells, each unit cell including a structure having first and second alternating layers, said first alternating layer including a double layer of at least one of Bi-oxide and Bi/Pb-oxide, said second alternating layer including perovskite cells having alternating layers of Cu-oxide and at least one of Sr-oxide and Ca-oxide, and said structure including three Cu-oxide layers between two double layers.

2. The superconductor of claim 1 wherein d is approximately equal to 2y.

3. The superconductor of claim 1 wherein d is approximately equal to u.

4. A superconductor of the Bi—Sr—(Ca)—CuO$_2$ system comprising:

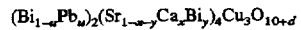

wherein $0.01<x<0.5$
$0 \leq y<x<0.5$
$0 \leq d$
$0 \leq u$, said superconductor having a layer structure formed by the oxides including bismuth, lead, strontium, calcium, and copper wherein the layer sequence of the oxides is as follows: at least one compound chosen from the group consisting of bismuth and lead; at least one compound consisting of strontium and calcium; copper; at least one compound chosen from the group consisting of calcium and strontium; copper; at least one compound chosen from the group consisting of calcium and strontium; copper; at least one compound chosen from the group consisting of strontium and calcium; and at least one compound chosen from the group consisting of bismuth and lead, said superconductor having a transition temperature greater than 90 K.

5. The superconductor of claim 1, wherein lead is included only in the form of contaminants.

6. The superconductor of claim 1 wherein u lies between 0.1 and 0.3.

7. The superconductor of claim 6 wherein $u=0.2\pm10\%$.

8. A method of manufacturing a superconductor of the Bi—Sr—(Ca)—Cu—O2$_x$) system including $(Bi_{1-u}Pb_u)_2$ $(Sr_{1-x-y}Ca_xBi_y)_4CU_3O_{10+d}$ wherein $0.1<x<0.5$
$0<y<x<0.5$
$0<d$
$0<u$, having a transition temperature greater than 90 K., said superconductor consisting of unit cells, each unit cell including a structure having first and second alternating layers, said first alternating layer including a double layer of at least one of Bi-oxide and Bi/PB oxide, said second alternating layer including perovskite cells having alternating layers of Cu-oxide and at least one of Sr-oxide and Ca-oxide, said structure including three Cu-oxide layers between two double layers, comprising the steps of:

converting a material having a weighted-in quantity $Bi_{1.7}Pb_{0.4}$ $Sr_{1.7}$ $Ca_{2.1}$ $Cu_3$ at 800° C. for three hours to produce a first resultant material;

converting said first resultant material at 820° C. for 10 to 20 hours in air with an immediate grinding to produce a second resulting material;

grinding and processing said second resultant material to produce a third resuitant material; and sintering said third resultant material at approximately 843° C. for 60 through 120 hours in an argon-oxygen mixture having $P_O=1/13$ bar.

9. A method of manufacturing a superconductor comprising the steps of:

converting a material having a weighted-in quantity $Bi_{1.7}Pb_{0.4}Sr_{1.7}Ca_{2.1}Cu_3$ 800° C. for three hours to produce a first resultant material;

converting said first resultant material at 820° C. for 10 to 20 hours in air with immediate grinding to produce a second resultant material;

grinding and processing said second resultant material to produce a third resultant material; and sintering said third resultant material at 860° C. to 865° C. for 60 through 120 hours in air.

10. The superconductor of claim 1, at least one of said plurality of unit cells further comprising at least one of Bi and Pb.

11. A superconductor of the Bi—Sr—(Ca)—CuO$_x$ system comprising:

$$(Bi_{1-u}Pb_u)_2(Sr_{1-x-y}Ca_xBi_y)_4Cu_3O_{10+d}$$

wherein $0.01 < x < 0.5$ $0 \leq y < x < 0.5$ $0 \leq d$ $0 \leq u$, having a transition temperature greater than 90 K., said superconductor consisting of unit cells of a sintered structure, each unit cell including a structure having first and second alternating layers, said first alternating layer including a double layer of at least one of Bi oxide and Bi/Pb-oxide, said second alternating layer including perovskite cells having alternating layers of Cu oxide and at least one of Sr-oxide and Ca-oxide, and said superconductor having three Cu-oxide layers per half unit cell.

* * * * *